(12) United States Patent
Stolpman et al.

(10) Patent No.: US 8,836,436 B2
(45) Date of Patent: Sep. 16, 2014

(54) OVENIZED CRYSTAL OSCILLATOR ASSEMBLY

(75) Inventors: James L. Stolpman, Bloomingdale, IL (US); James H. Pinson, Des Plaines, IL (US)

(73) Assignee: CTS Corporation, Elkhart, IN (US)

( * ) Notice: Subject to any disclaimer, the term of this patent is extended or adjusted under 35 U.S.C. 154(b) by 643 days.

(21) Appl. No.: 12/904,728

(22) Filed: Oct. 14, 2010

(65) Prior Publication Data

US 2011/0096510 A1    Apr. 28, 2011

Related U.S. Application Data

(60) Provisional application No. 61/279,633, filed on Oct. 23, 2009.

(51) Int. Cl.
  *H03B 1/00* (2006.01)
  *H03B 5/04* (2006.01)
  *H03H 9/10* (2006.01)

(52) U.S. Cl.
  CPC ... *H03B 5/04* (2013.01); *H03H 9/10* (2013.01)
  USPC ..... 331/68; 331/158; 331/116 R; 331/116 FE

(58) Field of Classification Search
  USPC ...... 331/66, 68, 69, 176, 158, 116 R, 116 FE; 361/728
  See application file for complete search history.

(56) References Cited

U.S. PATENT DOCUMENTS

| | | | |
|---|---|---|---|
| 5,640,746 A * | 6/1997 | Knecht et al. | 29/25.35 |
| 6,229,404 B1 * | 5/2001 | Hatanaka | 331/68 |
| 6,608,531 B2 * | 8/2003 | Stolpman et al. | 331/176 |
| 7,466,210 B2 * | 12/2008 | Knecht et al. | 331/68 |
| 7,825,742 B2 * | 11/2010 | Lee et al. | 331/158 |

* cited by examiner

*Primary Examiner* — Arnold Kinkead
(74) *Attorney, Agent, or Firm* — Daniel J. Deneufbourg

(57) ABSTRACT

An oscillator assembly which, in one embodiment, is an ovenized crystal oscillator assembly including an enclosure defined by a base and a lid which is seated on the base. The components of the oscillator assembly are supported by the base and located under the lid. The base and the lid together define an interior oven and are both preferably made of an insulative thermoplastic material to maximize the heat retention and oven performance of the oscillator assembly. In one embodiment, the lid and the base incorporate a clip for securing the lid to the base.

5 Claims, 5 Drawing Sheets

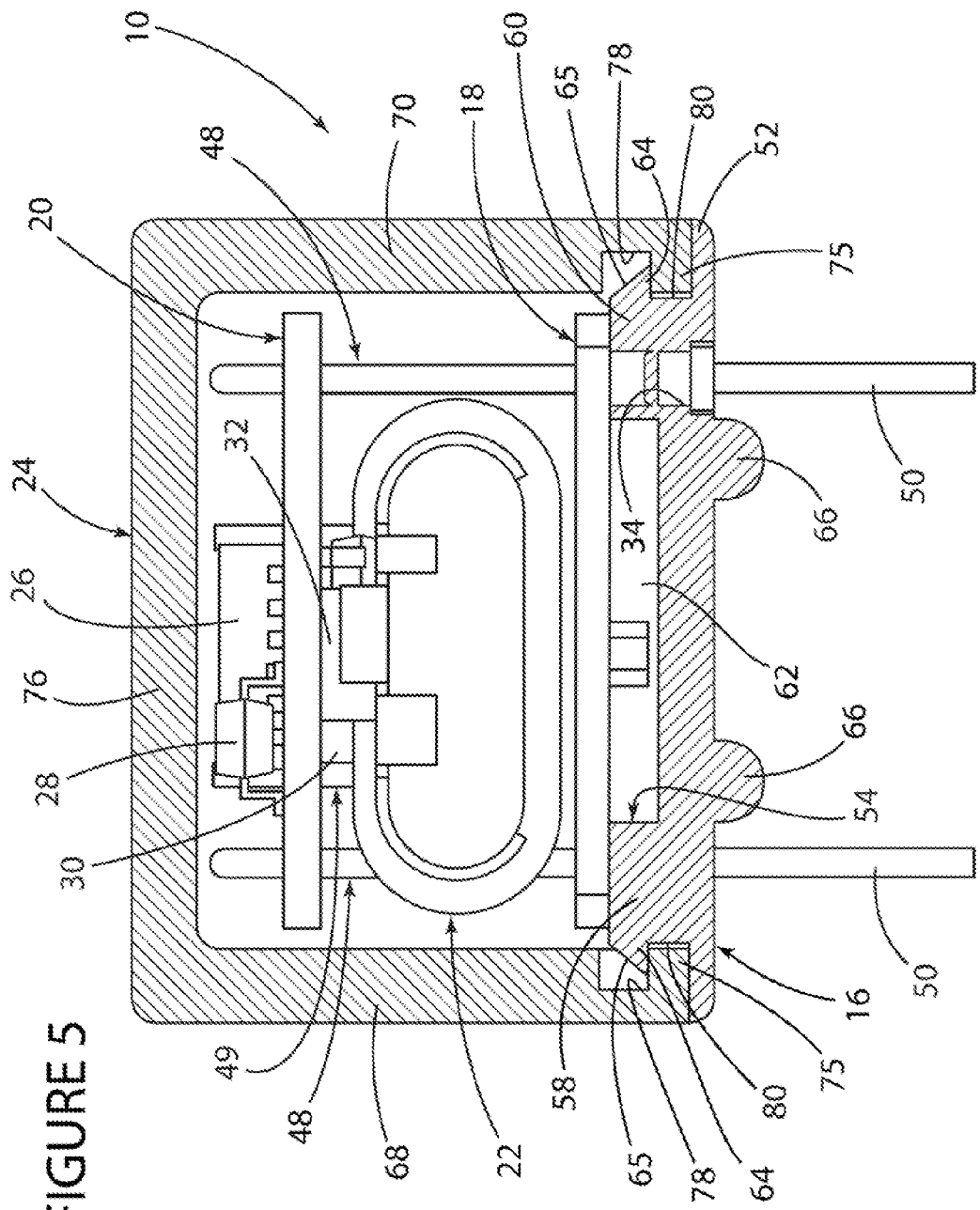

OVENIZED CRYSTAL OSCILLATOR ASSEMBLY

CROSS-REFERENCE TO RELATED APPLICATION

This application claims the benefit of the filing date and disclosure of U.S. Provisional Application Ser. No. 61/279,633 filed on Oct. 23, 2009 which is explicitly incorporated herein by reference as are all references cited therein.

FIELD OF THE INVENTION

This invention relates generally to an oscillator assembly and, in one embodiment, to an ovenized crystal oscillator assembly.

BACKGROUND OF THE INVENTION

Oscillators are well known devices for providing a reference frequency source. The oscillator typically has a quartz crystal or other resonator and also has electronic compensation circuitry to stabilize the output frequency. Various methods are known for stabilizing the output frequency as the temperature of the oscillator changes.

Ovenized oscillators (OCXOs) heat the temperature sensitive portions of an oscillator in an enclosure or oven, defined by a base and a lid, to a uniform temperature. Ovenized oscillators contain a heater located in the oven, a temperature sensor, and circuitry on the substrate to control the heater.

Although currently available oscillators have proven satisfactory for most applications, there is a continued need for higher performance, more efficient, lower cost oscillator including ovenized oscillators.

SUMMARY OF THE INVENTION

The present invention is directed generally to an oscillator assembly in which an enclosure is defined by a base and a lid which is seated on the base and which, in accordance with the invention, are preferably both made of a suitable thermoplastic material to maximize the heat retention and power reduction characteristics and performance of the oscillator assembly.

In one embodiment, the oscillator assembly is an ovenized crystal oscillator assembly and the base and the lid together define an interior oven. Further, in one embodiment, the thermoplastic material is polyether-ether-ketone and has a thickness of about 1 mm.

Further, in one embodiment, the base includes a floor and the oscillator assembly further comprises a first substrate spaced from the floor of the base, a resonator which is located above the first substrate and the lid covers the resonator and the first substrate and abuts against the base.

In one embodiment, the oscillator assembly further comprises a second substrate in a spaced and suspended relationship over the first substrate, a plurality of conductor pins extending through the base and the first and second substrates for holding the second substrate in a suspended relationship over the first substrate and electrically connecting the first and second substrate, the resonator is located between the first and second substrates and coupled to the second substrate, and the lid covers the first and second substrates.

In one embodiment, the oscillator assembly further comprises a clip for securing the lid to the base. The clip, in one embodiment, is defined by at least a first groove or recess in one of the lid and the base and at least a first projection in the other of the lid and the base which extends into the at least first groove or recess for securing the lid to the base. In one embodiment, the first projection is an ear on the base which extends into the first groove defined in an interior surface of a side wall of the lid. Further, in one embodiment, the base includes at least first and second walls projecting outwardly therefrom and an ear extends outwardly from each of the first and second walls.

Other advantages and features of the present invention will be more readily apparent from the following detailed description of the preferred embodiment of the invention, the accompanying drawings, and the appended claims.

BRIEF DESCRIPTION OF THE DRAWINGS

These and other features of the invention can best be understood by the following description of the accompanying drawings as follows:

FIG. 5 is a vertical cross-sectional view of the ovenized crystal oscillator assembly of FIG. 1.

DETAILED DESCRIPTION

Figure 1:
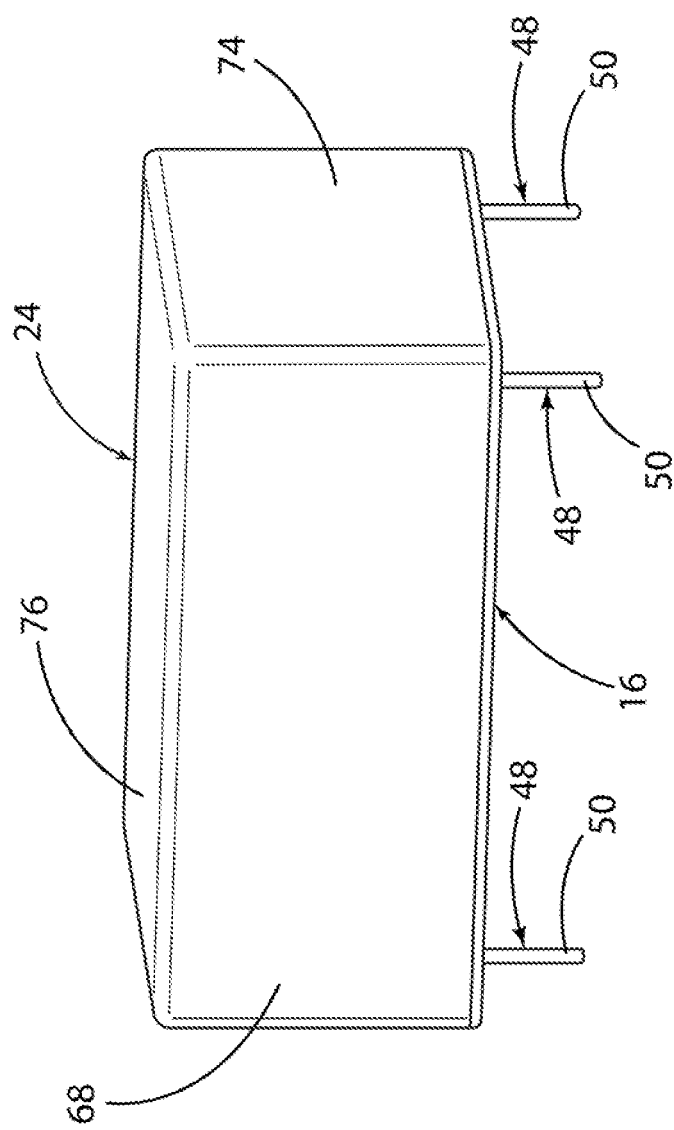
FIG. 1 is an enlarged perspective view of one embodiment of an oscillator assembly in the form of an ovenized crystal oscillator assembly incorporating the features of the present invention.

FIGS. 1-5 depict one representative or exemplary embodiment of an oscillator assembly in accordance with the present invention which, in the embodiment shown, is in the form of an ovenized crystal oscillator assembly (OCXO) 10 incorporating the features of the present invention.

Ovenized crystal oscillator assembly 10 which, in the embodiment shown is of the dual-in-line kind and measures approximately 13 mm in width by 20 mm in length and 10 mm in height, is comprised of at least the following components: a base 16 (FIGS. 1, 2, 3, and 5); a first substrate in the form of a printed circuit board (PCB) 18 (FIGS. 2 and 5) located above the base 16 and, in the embodiment shown, seated on a platform 54 in a relationship spaced from the base 16; a second substrate in the form of a printed circuit board (PCB) 20 (FIGS. 2 and 5) suspended over, spaced from, and parallel to the first printed circuit board (PCB) 18; a crystal resonator can assembly 22 (FIGS. 2 and 5) located in the space between the first and second printed circuit boards 18 and 20 and mounted to the underside of the second printed circuit board 20; and a lid or cover 24 (FIGS. 1, 2, 4, and 5) which is seated on top of the base 16 and covers the printed circuit boards 18 and 20 and the crystal can assembly 22.

Figure 2:
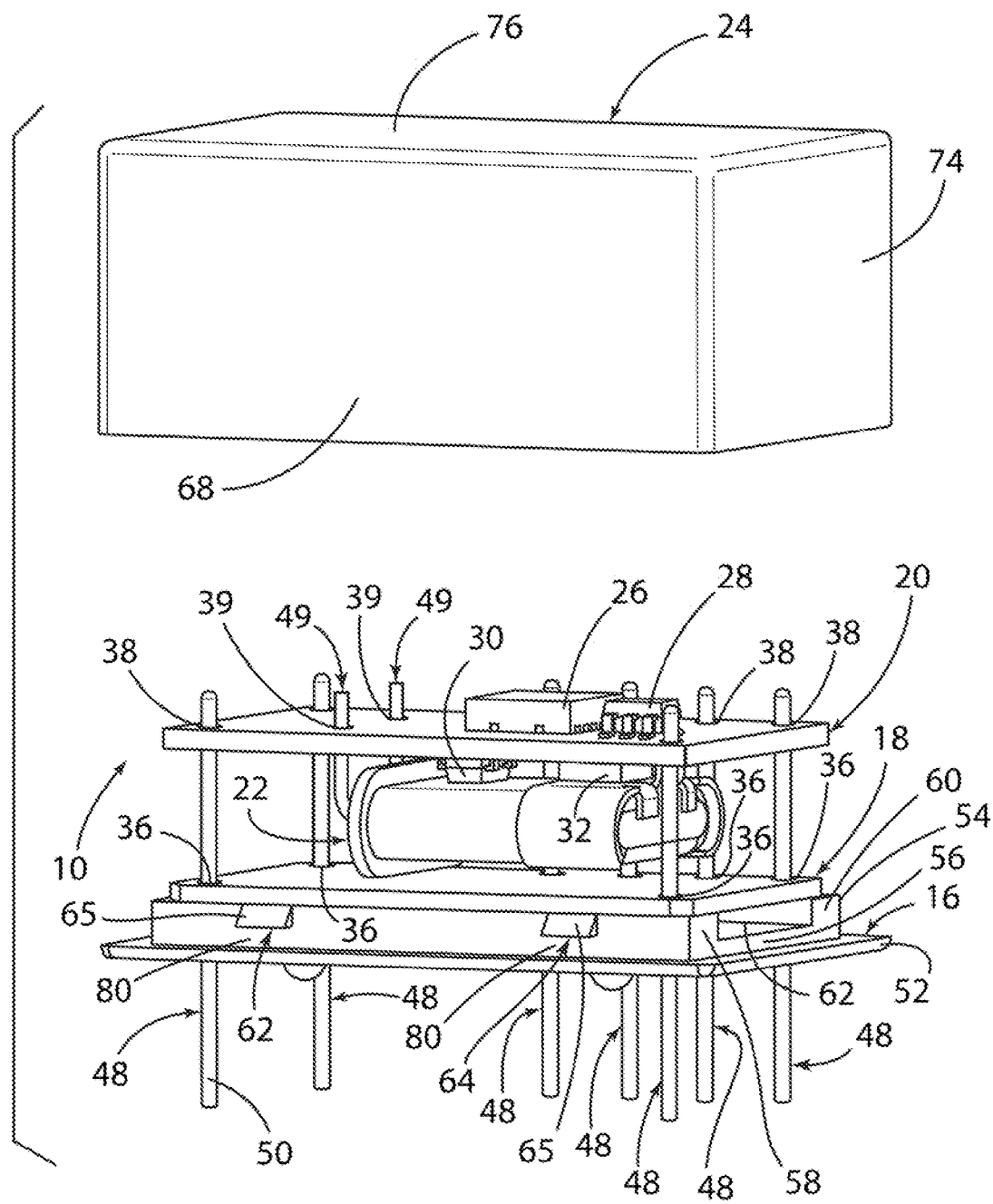
FIG. 2 is an enlarged perspective view of the ovenized crystal oscillator assembly of FIG. 1 with the lid exploded therefrom.
Figure 3:
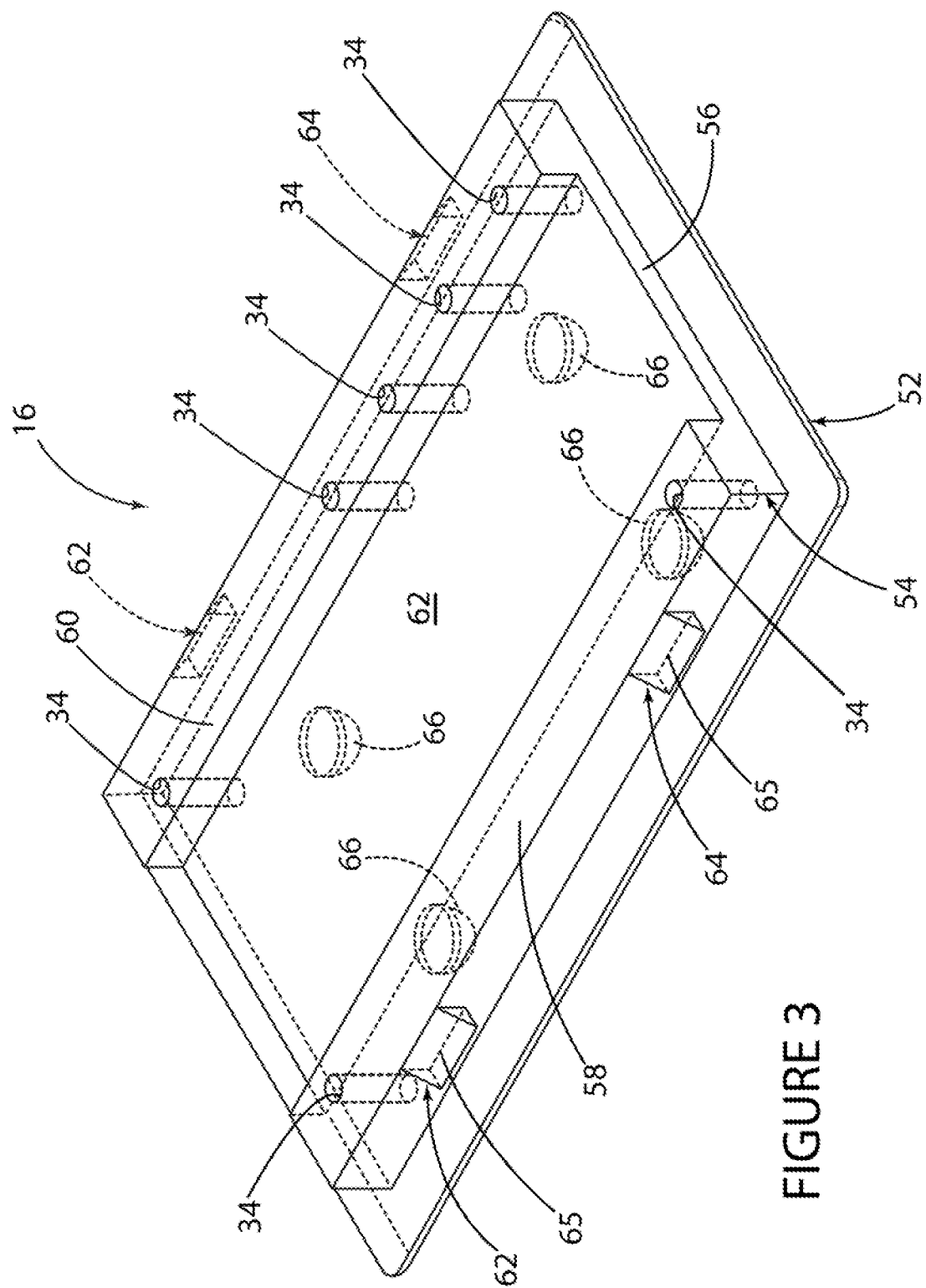
FIG. 3 is an enlarged top perspective view of the base of the ovenized crystal oscillator assembly of FIG. 1.

Although not shown or described in any detail, it is understood that the oscillator assembly 10 includes a plurality of appropriate electrical/electronic components seated on or suspended over the base 16 and under the lid 24 and, in the embodiment shown, mounted on each of the generally rectangularly shaped glass epoxy laminate, multi-layer printed circuit boards 18 and 20 including, for example, an oscillator 26 which in the embodiment shown is of the integrated circuit type, an amplifier 28, another amplifier 30, and a heater 32 mounted on the upper and lower surfaces of the printed circuit board 20 as shown in FIGS. 2 and 5. Several of the other components and circuitry normally associated with ovenized crystal oscillator assemblies including, for example, the temperature sensor and the temperature control circuitry have not been shown.

A plurality of through-holes 34 (FIG. 3) are defined in, and extend between the top and bottom surfaces of, the base 16. A plurality of through-holes 36 (FIG. 2) are defined in, and extend between the top and bottom surfaces of, the printed circuit board 18. A plurality of through-holes 38 (FIG. 2) are defined in, and extend between the top and bottom surfaces of, the printed circuit board 20. In the embodiment shown, the through-holes 34, 36, and 38 in each of the respective base 16, printed circuit board 18, and printed circuit board 20 are located in the respective corners of the base 16, the printed circuit board 18, and the printed circuit board 20. The printed circuit board 20 defines a pair of additional spaced-apart, co-linear through-holes 39 (FIG. 2) extending between the top and bottom surfaces thereof.

The base 16, the printed circuit board 18, and the printed circuit board 20 are oriented and positioned relative to each other in a parallel and spaced-apart relationship wherein the respective through-holes 34, 36, and 38 therein are in alignment with each other and an elongate conductor pin 48 (FIGS. 2 and 5) extends through each of the four sets of aligned through-holes 34, 36, and 38 in a relationship normal to the base 16, the printed circuit board 18, and the printed circuit board 20. A generally L-shaped conductor pin 49 (FIGS. 2 and 5) extends from the base of the crystal resonator can assembly 22 upwardly into and through the bottom surface and each of the through-holes 39 defined in the printed circuit board 20.

As shown in FIGS. 2 and 5, the pins 48 define not only conductors which electrically connect the two printed circuit boards 18 and 20 and the respective components thereon to each other but also define respective posts which hold the printed circuit board 20 in a spaced and suspended relationship over the printed circuit board 18. The pins 48 additionally define respective lower ends 50 (FIGS. 2 and 5) adapted to be coupled to and extend through the respective apertures (not shown) of a customer's motherboard (not shown).

Generally rectangularly-shaped base 16 (shown in greater detail in FIGS. 2, 3, and 5) includes a generally rectangularly-shaped flat plate 52 and a platform 54 which, in the embodiment shown, is unitary with, and extends outwardly and upwardly from, the top flat surface of the plate 52.

The platform 54 includes a generally rectangularly-shaped floor or step 56 (FIGS. 2 and 3) which is raised and stepped from the top surface or floor of the plate 52 of the base 16 and at least two longitudinally extending and elongate spaced-apart side walls or pedestals or posts or projections 58 and 60 (FIGS. 2, 3, and 5) which extend outwardly and upwardly from the opposed peripheral longitudinally extending side edges of the floor 56. The pair of walls 58 and 60 are oriented in a spaced-apart and parallel relationship relative to each other and in combination with the floor 56 define a central, generally rectangularly-shaped interior cavity or basin 62 (FIGS. 2, 3, and 5) in the base 16.

A pair of spaced-apart and co-linear, clip ears or projections 62 (FIGS. 2 and 3) and 64 (FIGS. 2, 3, and 5) protrude outwardly from the exterior face of each of the pair of walls 58 and 60 of the platform 54 of the base 16. Each of the clip ears 62 and 64 includes an outer camming surface 65 (FIGS. 2, 3, and 5) which slopes downwardly and outwardly from the top rim of each of the walls 58 and 60 in the direction of the plate 52 of the base 16.

Additionally, at least four dimples 66 (FIGS. 3 and 5) protrude unitarily outwardly from the lower surface of the plate 52 of the base 16 to allow the oscillator assembly 10 to be seated on the customers motherboard (not shown) in a balanced and spaced relationship thereto. All of the through-holes 34 defined in the base 16 extend through the floor 56 and the respective walls 58 and 60 in a spaced-apart and co-linear relationship.

As shown in FIGS. 2 and 5, the printed circuit board 18 is seated over the top of the platform 54 of the base 16 in a relationship wherein the opposed longitudinally extending peripheral side edges of the printed circuit board 18 are seated and abutted against the top peripheral longitudinally extending rim or exterior surface of each of the respective walls 58 and 60 of the platform 54 and the center portion of the printed circuit board 18 is located directly above and overlies the cavity/basin 62 and in a spaced and parallel relationship to the floor 56 of the base 16.

Figure 4:
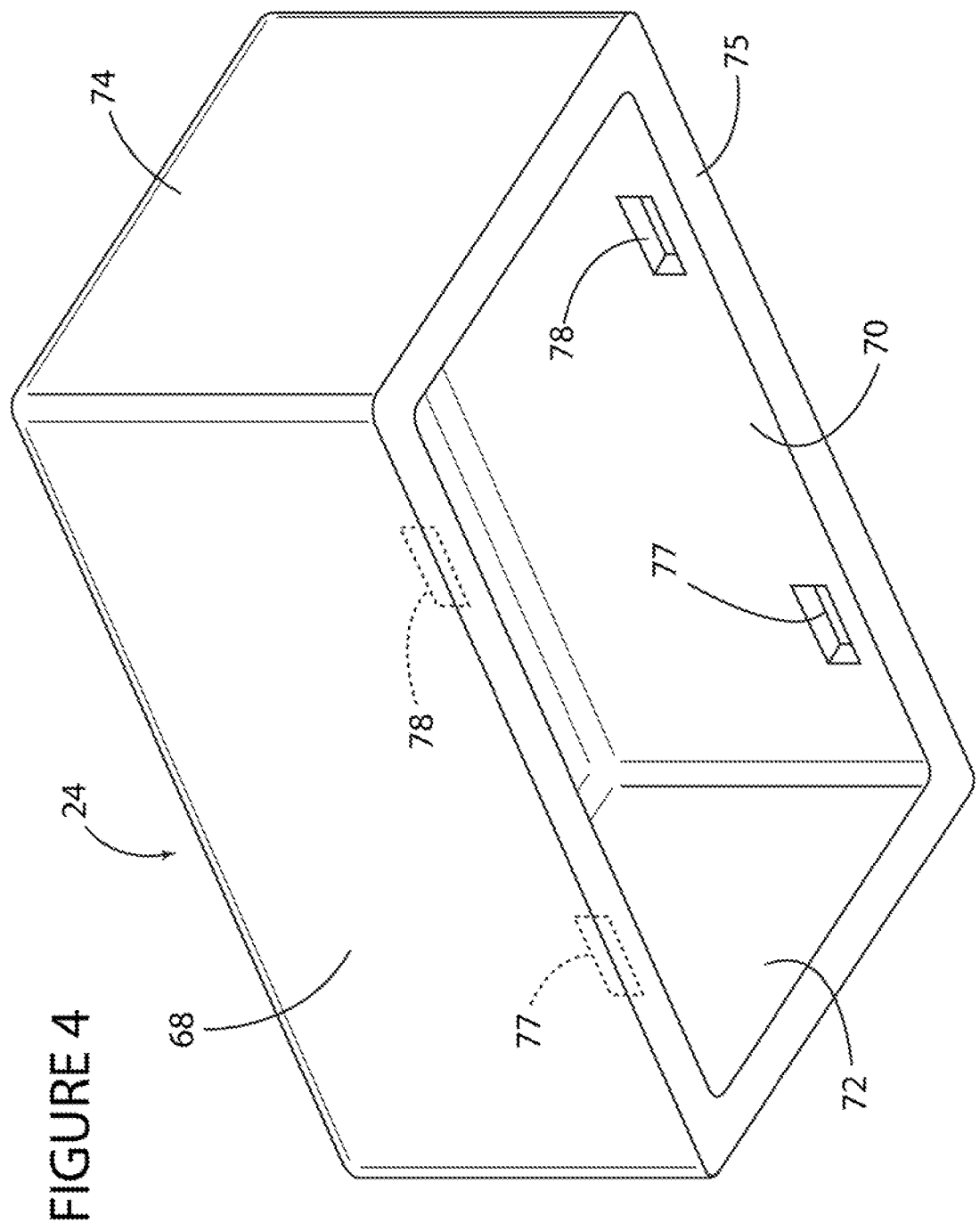
FIG. 4 is an enlarged bottom perspective view of the lid of the ovenized crystal oscillator assembly of FIG. 1.

The lid 24 (shown in FIGS. 1, 2, 4 and 5) is seated on and coupled to the top of the plate 52 of the base 16. The lid 24 includes a pair of opposed longitudinal walls 68 and 70 (FIGS. 4 and 5), a pair of opposed transverse walls 72 and 74 (FIG. 4), and a top wall or roof 76 (FIGS. 1, 2, and 5). The walls 68, 70, 72, and 74 in combination define a circumferentially extending peripheral lower flat rim or exterior surface 75 (FIGS. 4 and 5). The interior surface of each of the longitudinal walls 68 and 70 additionally defines a pair of spaced-apart, co-linear recesses or grooves 77 and 78 (FIGS. 4 and 5). The recesses 77 and 78 in the wall 68 are positioned in a diametrically opposed relationship to the recesses 77 and 78 in the wall 70.

As shown in FIG. 5, the lid 24 is seated on and over the base 16 in a relationship wherein the lower rim 75 of the respective walls 68, 70, 72, and 74 thereof is seated on and abutted against the top surface of the plate 52 of the base 16 and the clip ears 62 and 64 on each of the respective walls 58 and 60 of the platform 54 of the base 16 are located in the interior of the respective recesses 77 and 78 in the respective walls 68 and 70 of the lid 24 to lock the lid 24 to the base 16.

Although not shown in any of the FIGURES, it is understood that, when the lid 24 is seated over the base 16, the lower rim 75 of the respective walls 68, 70, 72, and 74 of the lid 24 initially abuts against the outer camming surface 65 of each of the clip ears 62 and 64 which, as the lid 24 is lowered further downwardly on the assembly 10 in the direction of the plate 52, causes the rim 75 of the walls 68 and 70 to initially flex outwardly and then flex or snap back inwardly after the rim 75 of the walls 68 and 70 clears the respective clip ears 62 and 64 and the rim 75 is wedged in the space or groove 80 (FIGS. 2 and 5) defined between the bottom surface of the respective clip ears 62 and 64 and the top surface of the plate 52 to lock the lid 24 to the base 16.

Thus, according to the invention, the ears 62 and 64, the rim 75 of lid walls 68 and 70, and the recesses 77 and 78 defined in each of the lid walls 68 and 70 together define a clip which secures the lid 24 to the base 16 and eliminates the need to epoxy or solder the lid 24 to the base 16 in applications where a non-hermetic seal between the lid 24 and the base 16 will suffice.

The base 16 and/or lid 24 of the oscillator assembly 10 may be made of a suitable insulative, non-substrate (non-printed circuit board or ceramic or laminate) material with improved heat retention characteristics such as, for example, a metal material or a suitable high temperature thermoplastic material such as, for example, a PEEK (polyether-ether-ketone) organic polymer thermoplastic material having a melting point greater than at least about 260 degrees centigrade, i.e., the melting point of standard high temperature re-flow solder.

In a preferred embodiment of the present invention, both the base 16 and the lid 24 are preferably made from the high temperature thermoplastic material such as PEEK and the thickness of each of the walls of the lid 24 and the thickness of the platform 54 of the base 16 is about 1.0 mm. The use of a lid 24 made of a thermoplastic material also advantageously allows for the flexing and snap back of the walls 68 and 70 of the lid 24 when the lid 24 is clipped to the base 16.

The use of at least a lid 24 and a base 16, both made of thermoplastic material, has been shown in tests to create an oscillator assembly 10 requiring approximately 22% less power than comparable oscillator assemblies available today.

While the invention has been taught with specific reference to a dual-in-line ovenized crystal oscillator embodiment, someone skilled in the art will recognize that changes can be made in form and detail without departing from the spirit and the scope of the invention which is directed broadly to an oscillator assembly where, in one embodiment, both the base and the lid thereof are made of a suitable insulative high temperature thermoplastic material and, in another embodiment, where a clip feature additionally allows the lid to be secured to the base.

The described ovenized crystal oscillator assembly embodiment is thus to be considered in all respects only as illustrative and not restrictive and it is understood that the invention encompasses all other types of oscillator assemblies such as, for example, voltage controlled saw or crystal oscillator assemblies and temperature compensated saw or crystal oscillator assemblies which include at least an enclosure defined by a base and a lid covering the base. The scope of the invention is, therefore, indicated by the appended claims rather than by the foregoing description. All changes that come within the meaning and range of equivalency of the claims are to be embraced within their scope.

What is claimed is:

1. An oscillator assembly comprising an enclosure defined by a base and a lid, both made of a thermoplastic material, the base including a floor, the oscillator assembly further comprising a first substrate spaced from the floor, a resonator located above the first substrate, and the lid covering the resonator and the first substrate and being coupled to the base and a platform between the floor of the base and the first substrate, the first substrate being seated against a top of the platform, wherein the platform is defined by a peripheral wall defining a cavity in the base, the first substrate being seated against a top of the peripheral wall in a relationship overlying the cavity and the lid including a peripheral rim abutting against the base.

2. The oscillator assembly of claim 1, wherein a plurality of conductor pins extend through the base and the first substrate.

3. An oscillator assembly comprising at least a base; a lid made of a thermoplastic material and including a wall seated on the base; and a clip for securing the lid to the base, the clip being defined by at least a first groove in one of the wall of the lid and the base and at least a first projection in the other of the wall of the lid and the base which extends into the at least first groove for securing and providing a non-hermetic seal between the lid and the base, the first projection including an outer sloped camming surface and extending in a direction generally normal to the wall of the lid.

4. An oscillator assembly comprising at least a base; a lid made of a thermoplastic material and including a wall seated on the base; and a clip for securing the lid to the base, the clip being defined by at least a first groove in one of the lid and the base and at least a first projection in the other of the lid and the base which extends into the at least first groove for securing the lid to the base, the first projection being an ear on the base that includes an outer sloped camming surface and extends in a direction generally normal to the wall of the lid and extends into the first groove defined in an interior surface of the wall of the lid.

5. An oscillator assembly comprising at least a base; a lid seated over the base; and a clip for securing the lid to the base, the clip being defined by at least a first groove in one of the lid and the base and at least a first projection in the other of the lid and the base which extends into the at least first groove for securing the lid to the base, the first protection being an ear on the base which extends into the first groove defined in an interior surface of a side wall of the lid, wherein the base includes at least first and second walls projecting outwardly therefrom and an ear extends outwardly from each of the first and second walls.

\* \* \* \* \*